United States Patent
Cho

(10) Patent No.: US 6,400,606 B1
(45) Date of Patent: Jun. 4, 2002

(54) SENSE AMPLIFIER CIRCUIT FOR USE IN A NONVOLATILE SEMICONDUCTOR MEMORY DEVICE

(75) Inventor: Sung-Hee Cho, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/677,287

(22) Filed: Oct. 2, 2000

(30) Foreign Application Priority Data

Oct. 1, 1999 (KR) .............................. 99-42356

(51) Int. Cl.$^7$ .............................................. G11C 11/34
(52) U.S. Cl. ................................ 365/185.2; 365/185.24
(58) Field of Search ........................... 365/185.2, 185.24

(56) References Cited

U.S. PATENT DOCUMENTS

| | | | |
|---|---|---|---|
| 4,514,828 A | * 4/1985 | Closson et al. | 365/185 |
| 6,118,701 A | * 9/2000 | Uekubo | 365/185.2 |
| 6,163,484 A | * 12/2000 | Uekubo | 365/185.2 |

* cited by examiner

*Primary Examiner*—M. Tran
(74) *Attorney, Agent, or Firm*—Marger Johnson & McCollom, P.C.

(57) ABSTRACT

A novel sense amplifier circuit is provided that includes a resistor and a reference cell connected in parallel to a reference line. The reference cell is composed of a floating-gate field effect transistor having the same characteristic as a memory cell. The reference cell is programmed so as to have a threshold voltage between the threshold voltages of an associated memory cell transistor in an on-state and an off state. According to this circuit configuration, a reference current is determined only by a current flowing through the resistor, when a gate voltage to a memory/reference cell is higher than the threshold voltage of the reference cell. This forces the reference current to exist between the on-cell current and the off-cell current, regardless of the gate voltage. Therefore, the maximum operating voltage of the sense amplifier circuit according to the invention is not limited by a variation of the gate voltage to the memory/reference cell, or by a variation of a power supply voltage.

3 Claims, 2 Drawing Sheets

SENSE AMPLIFIER CIRCUIT FOR USE IN A NONVOLATILE SEMICONDUCTOR MEMORY DEVICE

This application relies for priority upon Korean Patent Application No. 1999-42356, filed on Oct. 1, 1999, the contents of which are herein incorporated by reference in their entirety.

FIELD OF THE INVENTION

The present invention relates to semiconductor memory devices and, more particularly, to a sense amplifier circuit, which is used in a nonvolatile semiconductor memory device.

BACKGROUND OF THE INVENTION

An EPROM or EEPROM cell (or flash memory cell) typically is made from a floating-gate field effect transistor. The floating-gate of a programmed memory cell is charged with electrons, and the electrons in turn render the source-drain path under the charged floating gate nonconductive when a predetermined voltage is applied to the control gate. The nonconductive state is read by a sense amplifier as a "zero" bit (or as a "one" bit). At this time, the programmed memory cell has an off state. The floating-gate conductor of a non-programed cell is neutrally charged (or slightly positively or negatively charged) such that the source-drain path under the non-programmed floating gate is conductive when the predetermined voltage is applied to the control gate. The conductive state is read by a sense amplifier as a "one" bit (or as the "zero" bit). At this time, the non-programmed cell has an on state.

An array of a nonvolatile semiconductor memory device may contain millions of floating-gate memory cells arranged in rows and columns. The sources of each cell in a column are connected to a source-column line. The source-column line for a selected cell may be connected to reference potential or ground during reading of the selected cell by a sense amplifier. The drains of each cell in a column are connected to a separate bit line (drain-column line) and the drain-column line for a selected cell is connected to an input terminal of the sense amplifier during reading of the selected cell. The control gates of each cell in a row are connected to a word line, and the word line for a selected cell is connected to the predetermined select voltage during reading of the selected cell.

During the read operation, the current through the selected cell is compared with a reference current to determine whether or not the selected cell is programmed with a "0" or a "1". The reference current is derived from reference circuitry, which may include one or more floating-gate cells identical to the cell being read or may include a column of such reference s cells. The reference circuitry is connected to tie other input terminal of a current mirror type differential amplifier via a reference line. In order to determine whether a logic state of the selected memory cell is "1" or "0", the differential amplifier compares the voltage on the reference line with the voltage on the data line connected to the selected memory cell that is being road.

A conventional sense amplifier circuit with the above-described function is illustrated in FIG. 1.

Referring to FIG. 1, a reference number 12 indicates a floating-gate memory cell transistor, and reference numbers 14 and 16 indicate floating-gate reference cell transistors, respectively. A threshold voltage Vth of each of the serially-connected reference cell transistors 14 and 16 is identical to that of the memory cell with the transistor in its programmed state. This is also referred to as the memory cell transistor of the on state, or the "an on-cell transistor"; or the programmed memory cell. A drain of the memory cell transistor 12 is supplied with a power supply voltage Vcc through a load transistor 20 connected in series with an NMOS transistor 18, whose gate is connected to a bias voltage $V_{bias}$. Similarly, a drain of the reference cell transistor 16 is supplied with the power supply voltage Vcc through a load transistor 24 connected in series with an NMOS transistor 22, the gate of which is coupled to a bias voltage $V_{RBias}$. A sense node $V_s$ between the transistors 18 and 20 and a reference node $V_R$ between the transistors 22 and 24 are connected to corresponding input terminals of a differential amplifier circuit 26, respectively.

A graph showing current characteristic curves of die on cell, the off cell and the reference cell is illustrated in FIG. 2. In FIG. 2, the curve Ion represents a current flowing via the un-programmed memory cell (referred to as "on-cell current"), the curve off represents a current flowing via the programmed memory cell (referred to as "off-cell current"), and the curve Iref represents a current flowing via the reference cell (referred to as "reference-cell current"). As described in FIG. 1, since the reference cell is composed of two on-cell transistors serially connected to each other, the reference-cell current Iref is half the on-cell current Ion.

In the conventional sense amplifier circuit, as illustrated in FIG. 2, the reference-cell current Iref is varied as a gate voltage Vg applied to the gates of the transistors 14 and 16 is varied. Herein, as well known to ones skilled in the art, since the gate voltage Vg is generated by use of the power supply voltage Vcc as a power source, it may be varied according to the variation of the power supply voltage Vcc. In this case, as illustrated in FIG. 2, the minimum operating voltage of the conventional sense amplifier circuit 10 is limited by the threshold voltage Vth1 of the on-cell transistor, while the maximum operating voltage thereof is limited by a gate voltage Vcmax at a point where the off-cell current Off curve intersects the reference-cell current Iref curve.

In the conventional sense amplifier circuit, a problem arises when the gate voltage Vg is increased above the maximum operating voltage Vccmax. That is, it is impossible to sense a logic state of the off cell. It means that a range of the operating voltage of the conventional sense amplifier circuit 10 is limited by the variation of the power supply voltage (or the gate voltage of the memory/reference cell transistor). That is, the operating voltage range of the circuit 10 is narrow, and thus not easily usable.

SUMMARY OF THE INVENTION

It is therefore an object of the invention to provide a sense amplifier circuit of a nonvolatile semiconductor memory device which generates a reference-cell current existing between an on-cell current and an off-cell current.

It is another object of the invention to provide a sense amplifier circuit of a nonvolatile semiconductor memory device which is capable of preventing an operating voltage range from being limited according to a variation of a power supply voltage (or gate voltage variation of a memory/reference cell).

In accordance with this and other objects, advantages and features of the present invention, a sense amplifier circuit for a semiconductor memory device is provided which a memory cell and a reference cell. The memory cell has either a first threshold voltage or a second threshold voltage, and a reference cell has a third threshold voltage between the first threshold voltage and the second threshold voltage, regardless of the value of Vg.

In the sense amplifier circuit, a first and a second load transistors is further provided in the sense amplifier. The first load transistor is coupled between a power supply voltage and a data line connected to the memory cell, and a second load transistor is coupled between the power supply voltage and a reference line connected to the reference cell. Furthermore, the sense amplifier circuit includes a resistor coupled in parallel to the reference cell and a differential amplifier. The differential amplifier receives signals from the data line and from the reference line commonly coupled to the reference cell and the resistor, and outputs either a high level or a low level to a logic state of the memory cell based on the potential of the reference line.

BRIEF DESCRIPTION OF THE DRAWINGS

A more complete appreciation of the present invention, and many of the attendant advantages thereof, will become readily apparent as the same becomes better understood by reference to the following detailed description, when considered in conjunction with the accompanying drawings in which like reference symbols indicate the same or similar components, wherein.

DESCRIPTION OF THE PREFERRED EMBODIMENT

The preferred embodiment of the invention will be more fully described with reference to the attached drawings.

A novel sense amplifier circuit according to the present invention includes a resistor and a reference cell connected in parallel to a reference line (or a reference node), and the reference cell is composed of a floating-gate field effect transistor having the same characteristic as a memory cell. The reference cell is programmed so as to have a threshold voltage of an intermediate value between a threshold voltage of an on-cell transistor and a threshold voltage of an off-cell transistor. According to this circuit configuration, a reference current (a current at the reference node which is connected to an input terminal of a differential amplifier) is determined only by a current flowing through the resistor when a gate voltage to a memory/reference cell is higher than the threshold voltage of the reference cell. This forces the reference current to exist between the on-cell current and the off-cell current. Therefore, the maximum operating voltage of the sense amplifier circuit according to the invention is not limited by a variation of the gate voltage to the memory/reference cell or by a variation of a power supply voltage. That is, the operating voltage range of the sense amplifier circuit is widened.

Figure 1:
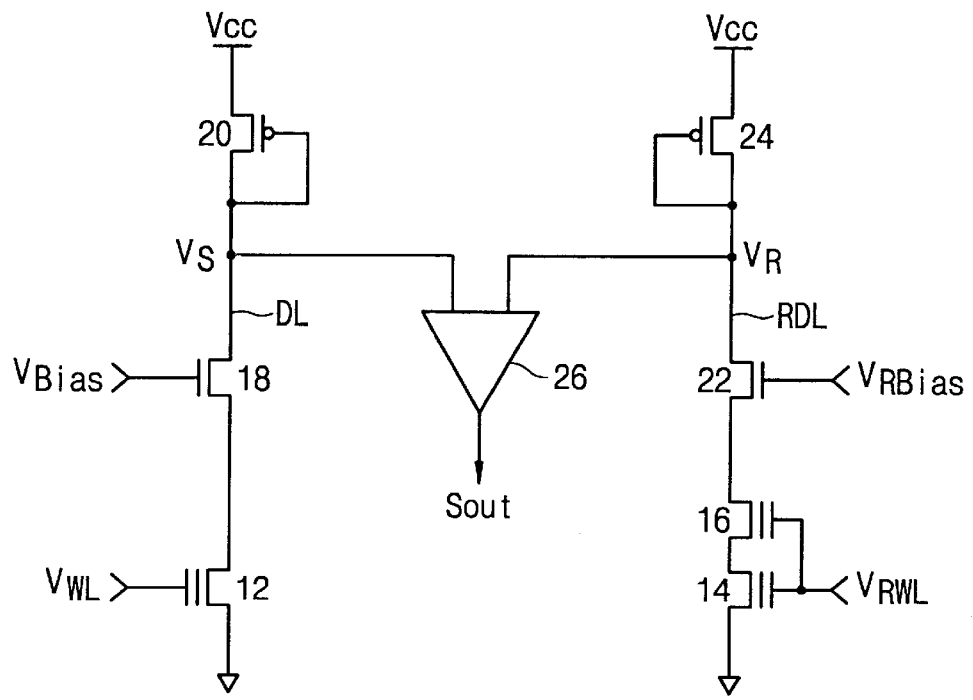
FIG. 1 is a detailed circuit diagram of a conventional sense amplifier circuit.
Figure 2:
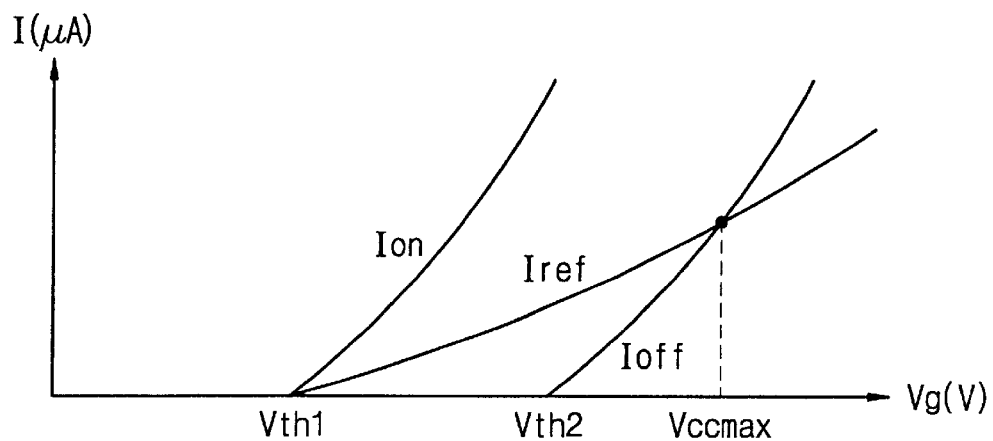
FIG. 2 is a diagram showing current characteristic curves of operation of elements of the sense amplifier circuit illustrated in FIG. 1.
Figure 3:
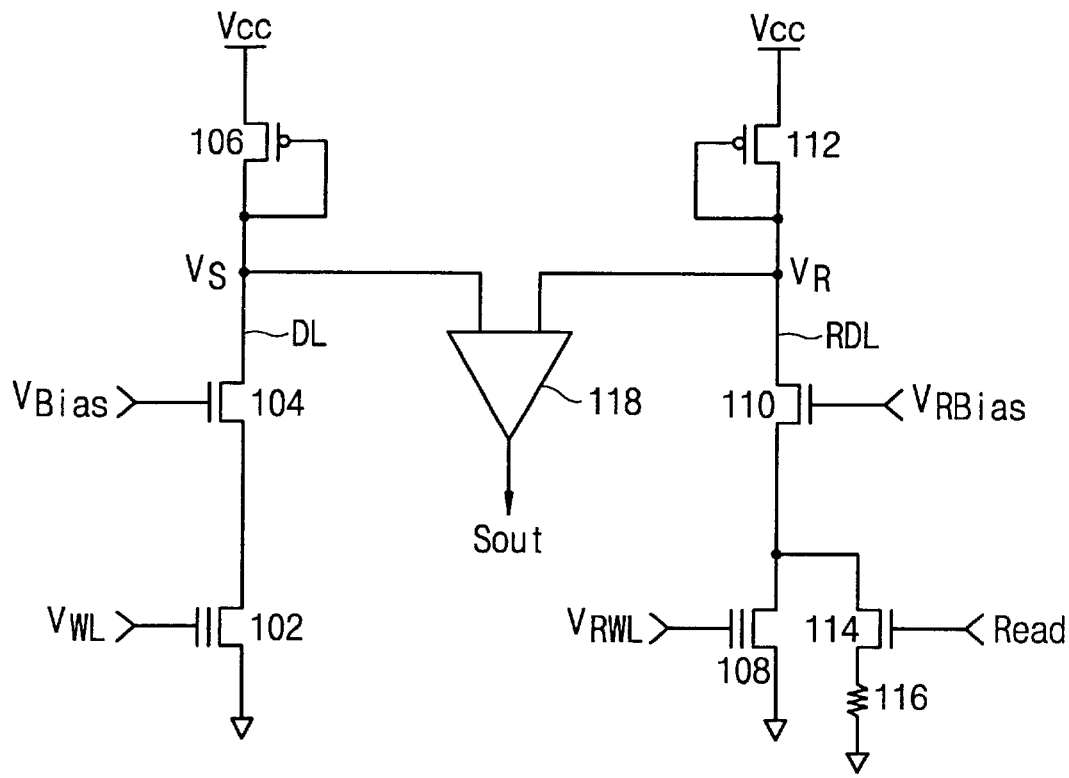
FIG. 3 is a detailed circuit diagram of a sense amplifier circuit according to the present invention.

FIG. 3 is a preferred embodiment of a sense amplifier circuit according to the present invention. The sense amplifier circuit 100 of die invention can be applied to floating-gate nonvolatile semiconductor memory devices such as an electrically programmable memory device, an electrically erasable and programmable memory device, a flash memory device, and the like.

Referring to FIG. 3, the sense amplifier circuit 100 of the invention includes a memory cell 102, which is composed of a floating-gate field effect transistor and is programmed either into the ON-condition or into the OFF-condition. A drain of the cell transistor 102 is coupled to a power supply voltage through a PMOS transistor 106 for load which is connected in series with an NMOS transistor 104. A source of the memory cell transistor 102 is grounded, and a control gate thereof is coupled to a word line voltage $V_{WL}$.

The sense amplifier circuit 100 further includes a floating-gate reference cell transistor 108, whose threshold voltage exists between the threshold voltages of the on-cell and off-cell transistors. In particular, the reference cell 108 is programmed with a threshold voltage which corresponds to an intermediate value between die threshold voltages of the on (a and off cells. A drain of the reference cell transistor 108 is coupled to the power supply voltage through a PMOS transistor 112 for load which is connected in series with an NMOS transistor 110. A source of die reference cell transistor 108 is grounded, and a control gate thereof is coupled to a reference word line voltage $V_{RWL}$. Herein, a voltage level of the word line voltage $V_{WL}$ is identical to that of the reference word line $V_{RWL}$.

As illustrated in FIG. 3, the sense amplifier circuit 100 further includes an NMOS transistor 114 and a resistor 116. The NMOS transistor 114 has a drain-source channel formed between the drain of the transistor 108 and one end of the resistor 116, and is turned on/off according to a logic state of a switch control signal Read representing a read operation of the memory cell. The other end of the resistor 116 is grounded. The switch control signal Read is at a logic high level when the memory device in which the sense amplifier circuit 100 is incorporated performs the read operation, and is at a logic low level during other operations. When the switch control signal Read goes high, the NMOS transistor 114 is turned on, and thereby current supplied from the load transistor 112 is constantly discharged to a ground voltage both via the NMOS transistor 114 and the resistor 116 and via the reference cell 108.

Referring now to FIG. 3, a data line DL, that is, a sense node $V_s$ between the PMOS transistor 106 and the NMOS transistor 104, is connected to one input terminal of the differential amplifier circuit 118. And, a reference line RDL, that is, a reference node VR between the PMOS transistor 112 and the NMOS transistor 110, is coupled to the other input terminal of the differential amplifier circuit 118, which outputs a high or low signal Sout according to the logic state of the memory cell 102 on the basis of a potential of the reference line RL.

According to the above-described sense amplifier circuit, when the gate voltage of the memory/reference cell is lower than the threshold voltage of the reference cell 108, current from the load transistor 112 is constantly discharged through the NMOS transistor 114 and the resistor 116. And, when the gate voltage of the memory/reference cell is higher than the threshold voltage of the reference cell 108, the current from the load transistor 112 is discharged not only through the NMOS transistor 114 and the resistor 116 but also through the reference cell 108.

Figure 4:
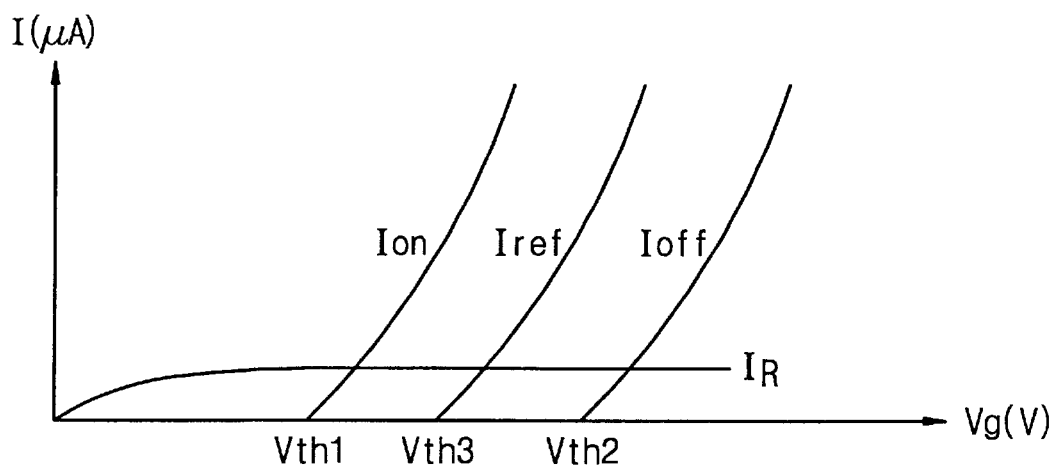
FIG. 4 is a diagram showing current characteristic curves of operation of elements of the sense amplifier circuit illustrated in FIG. 3.

FIG. 4 is a graph showing characteristic curves of the on-cell current, the off-cell current, the reference-cell current and a current through the resistor. In FIG. 4, the curve Ion represents a current flowing via the un-programmed memory cell, and the curve off a current flowing via the programmed memory cell. The curve Iref represents a current flowing via the reference cell, and the symbol JR represents a current flowing via the resistor 116.

As can be seen from FIG. 4, since the threshold voltage Vth3 of the reference cell 108 is set at an intermediate value between the threshold voltages Vth 1 and Vth2 of the on and off cells, the reference-cell current Iref is varied following a center portion between the characteristic curves of the currents Ion and off when the power supply voltage Vcc or the gate voltage Vg increases. The current $I_R$ through the resistor 116 constantly flows when the read operation is performed after power-up. As a result, the reference current, that is, current through the reference node $V_R$ exists between die currents Ion and I off. It means that although the power supply voltage Vcc or the gate voltage Vg of the memory/reference cell increases, the reference current Iref curve is not intersected by the current I off curve. That is, the operating voltage range of the sense amplifier circuit 100 is not limited by a variation of the power supply voltage Vcc (or the gate voltage of the memory/reference cell). In other words, the operating voltage range of the sense amplifier circuit 100 is widened.

The invention has been described using the exemplary preferred embodiment. However, it is to be understood that the scope of the invention is not limited to die disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A sense amplifier circuit for a nonvolatile semiconductor memory device comprising:

a memory cell transistor which has a drain coupled to a data line, a source coupled to a ground voltage, a floating gate, and a control gate coupled to a word line;

a first PMOS transistor which has a source coupled to a power supply voltage, and a drain and a gate commonly coupled to the data line;

a reference cell transistor which has a drain coupled to a reference line, a source coupled to the ground voltage, a floating gate, and a control gate coupled to a reference word line;

a second PMOS transistor which has a source coupled to the power supply voltage, and a drain and a gate commonly coupled to the reference line;

an NMOS transistor which has a drain coupled to the reference line, a gate coupled to a switch control signal, and a source;

a resistor which has one end coupled to the source of the NMOS transistor and the other end coupled to the ground voltage; and a differential amplifier which has one input coupled to the data line, the other input coupled to the reference line, and an output for outputting either a high level or a low level according to potentials on the data line and the reference line.

2. The circuit of claim 1, wherein the reference cell transistor has a threshold voltage between a threshold voltage of the memory cell transistor in an ON-condition, and a threshold voltage of die memory cell transistor in an OFF-condition.

3. The circuit of claim 1, wherein the word line and the reference line are driven with the same voltage level at a read operation of the memory device, and the switch control signal is activated during the read operation.

* * * * *

UNITED STATES PATENT AND TRADEMARK OFFICE
CERTIFICATE OF CORRECTION

PATENT NO. : 6,400,606 B1  Page 1 of 1
DATED : June 4, 2002
INVENTOR(S) : Cho

It is certified that error appears in the above-identified patent and that said Letters Patent is hereby corrected as shown below:

Column 1,
Lines 7 and 44, "arc" should read -- are --.
Line 60, "road" should read -- read --.

Column 2,
Line 3, "transistor;" should read -- transistor, --.
Line 13, "arc" should read -- are --.
Line 16, "die" should read -- the --.
Line 20, "curve off" should read -- curve Ioff --.
Line 39, "current Off" should read -- current Ioff --.

Column 3,
Line 66, "die" should read -- the --.
Lines 19 and 23, "die" should read -- the --.

Column 5,
Line 3, "JR" should read -- IR --.
Line 10, "off" should read -- Ioff --.
Lines 15 and 18, "die" should read -- the --.

Column 6,
Line 28, "die" should read -- the --.

Signed and Sealed this

Fifth Day of November, 2002

Attest:

JAMES E. ROGAN
Attesting Officer  Director of the United States Patent and Trademark Office